United States Patent
Van Brocklin et al.

(10) Patent No.: US 6,917,532 B2
(45) Date of Patent: Jul. 12, 2005

(54) MEMORY STORAGE DEVICE WITH SEGMENTED COLUMN LINE ARRAY

(75) Inventors: Andrew L. Van Brocklin, Corvallis, OR (US); Peter Fricke, Corvallis, OR (US)

(73) Assignee: Hewlett-Packard Development Company, L.P., Houston, TX (US)

(*) Notice: Subject to any disclaimer, the term of this patent is extended or adjusted under 35 U.S.C. 154(b) by 355 days.

(21) Appl. No.: 10/177,596

(22) Filed: Jun. 21, 2002

(65) Prior Publication Data

US 2003/0235063 A1 Dec. 25, 2003

(51) Int. Cl.⁷ .................................................. G11C 5/02
(52) U.S. Cl. ...................... 365/51; 365/63; 365/230.03; 365/173; 365/171
(58) Field of Search ........................ 365/51, 63, 230.03, 365/173, 171, 55, 158, 214

(56) References Cited

U.S. PATENT DOCUMENTS

| | | | |
|---|---|---|---|
| 4,442,507 A | 4/1984 | Roesner | |
| 4,489,478 A | 12/1984 | Sakurai | |
| 5,306,935 A | 4/1994 | Esquivel et al. | |
| 5,427,979 A | 6/1995 | Chang | |
| 5,835,396 A | 11/1998 | Zhang | |
| 6,034,882 A | 3/2000 | Johnson et al. | |
| 6,185,122 B1 | 2/2001 | Johnson et al. | |
| 6,351,406 B1 | 2/2002 | Johnson et al. | |
| 6,351,408 B1 | 2/2002 | Schwarzl et al. | |
| 6,754,124 B2 * | 6/2004 | Seyyedy et al. | ............ 365/214 |
| 6,778,421 B2 * | 8/2004 | Tran | ............ 365/105 |
| 6,781,858 B2 * | 8/2004 | Fricke et al. | ............ 365/51 |

OTHER PUBLICATIONS

"The Case for 3-D Microelectronics," Lee, Thomas, Ph.D., Internet, www.matrixsemi.com/files/10074901220.pdf.

* cited by examiner

*Primary Examiner*—Connie C. Yoha

(57) ABSTRACT

A memory storage device includes a first and second memory cell which each have a top end and a bottom end. A first and second first dimension conductor are substantially coplanar and parallel and extend in a first dimension. The first first dimension conductor intersects the bottom end of the first memory cell and the second first dimension conductor intersects the top end of the second memory cell. A first second dimension conductor extends in a second dimension and intersects the top end of the first memory cell and a second second dimension conductor extends in the second dimension and intersects the bottom end of the second memory cell. A first third dimension conductor which extends in a third dimension is positioned between the first and second memory cell to couple the first second dimension conductor to the second second dimension conductor.

55 Claims, 10 Drawing Sheets

MEMORY STORAGE DEVICE WITH SEGMENTED COLUMN LINE ARRAY

THE FIELD OF THE INVENTION

The present invention relates to the field of integrated circuit memories. More particularly the present invention relates to a memory storage device and method for a three dimensional cross point memory array.

BACKGROUND OF THE INVENTION

As the demand for integrated circuits continues to rise, manufacturers labor to incorporate increasingly greater numbers of transistors onto each die. Integrated circuit memories often times have higher transistor densities than other types of circuits, and as a result, tend to push the leading edge of the technology envelope. The memories are typically organized into two dimensional arrays wherein each memory cell in the array is intersected by a row conductor and a column conductor. The two dimensional memory arrays are often times limited in memory cell density by the minimum line widths of the technology used to fabricate the array. As a result, improvements in the memory densities are achieved when the minimum feature sizes of the integrated circuit process used to fabricate the memories are decreased.

One popular type of memory is a read-only memory (ROM). The two most common types of ROMs are mask ROMs and field programmable ROMs. With mask ROMs, the information stored in each memory cell is permanently programmed during the fabrication process and cannot be subsequently changed. Field programmable ROMs are not programmed during the fabrication process and are more desirable because they enable end users to store a single part type which can be used in many applications.

One type of field programmable ROM includes memory cells which have a storage element and a control component. The storage elements typically have a high resistance to current flow and can be programmed to have a low resistance by application of a suitable voltage across the storage element. The programmed configuration can be sensed by application of a read voltage across the storage element and by comparing the current passed through the programmed storage element to the current passed through a non-programmed storage element.

One disadvantage of the two dimensional ROM arrays are leakage currents which tend to make accurate memory reads more difficult as the number of memory cells in the arrays are increased. For example, the row and column lines which intersect memory cells in the array travel the entire length of the array. If a particular row and column line are selected and the read voltage is applied, other storage elements positioned along the row line or along the column line can provide leakage currents which make it more difficult to detect the difference between the non-programmed and programmed configurations. One approach to limit the leakage currents is to separate the column lines into portions which are each separately addressable. To accomplish this, additional peripheral circuitry must be added to read and write the individual column line portions. While this approach can reduce leakage currents by reducing the number of unselected storage elements connected to each column line portion, the number of memory cells in the array must be decreased to make room for the additional read and write circuits.

In view of the above, there is a need for an improved memory which has greater memory cell densities and reduced leakage currents.

SUMMARY OF THE INVENTION

One aspect of the present invention provides a memory storage device and method. The memory storage device includes a first and second memory cell which each have a top end and a bottom end. A first and second first dimension conductor are substantially coplanar and parallel and extend in a first dimension. The first first dimension conductor intersects the bottom end of the first memory cell and the second first dimension conductor intersects the top end of the second memory cell. A first second dimension conductor extends in a second dimension and intersects the top end of the first memory cell and a second second dimension conductor extends in the second dimension and intersects the bottom end of the second memory cell. A first third dimension conductor extends in a third dimension and is positioned between the first and second memory cell to couple the first second dimension conductor to the second second dimension conductor.

DESCRIPTION OF THE PREFERRED EMBODIMENTS

In the following detailed description of the preferred embodiments, reference is made to the accompanying drawings which form a part hereof, and in which is shown by way of illustration specific embodiments in which the invention may be practiced. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
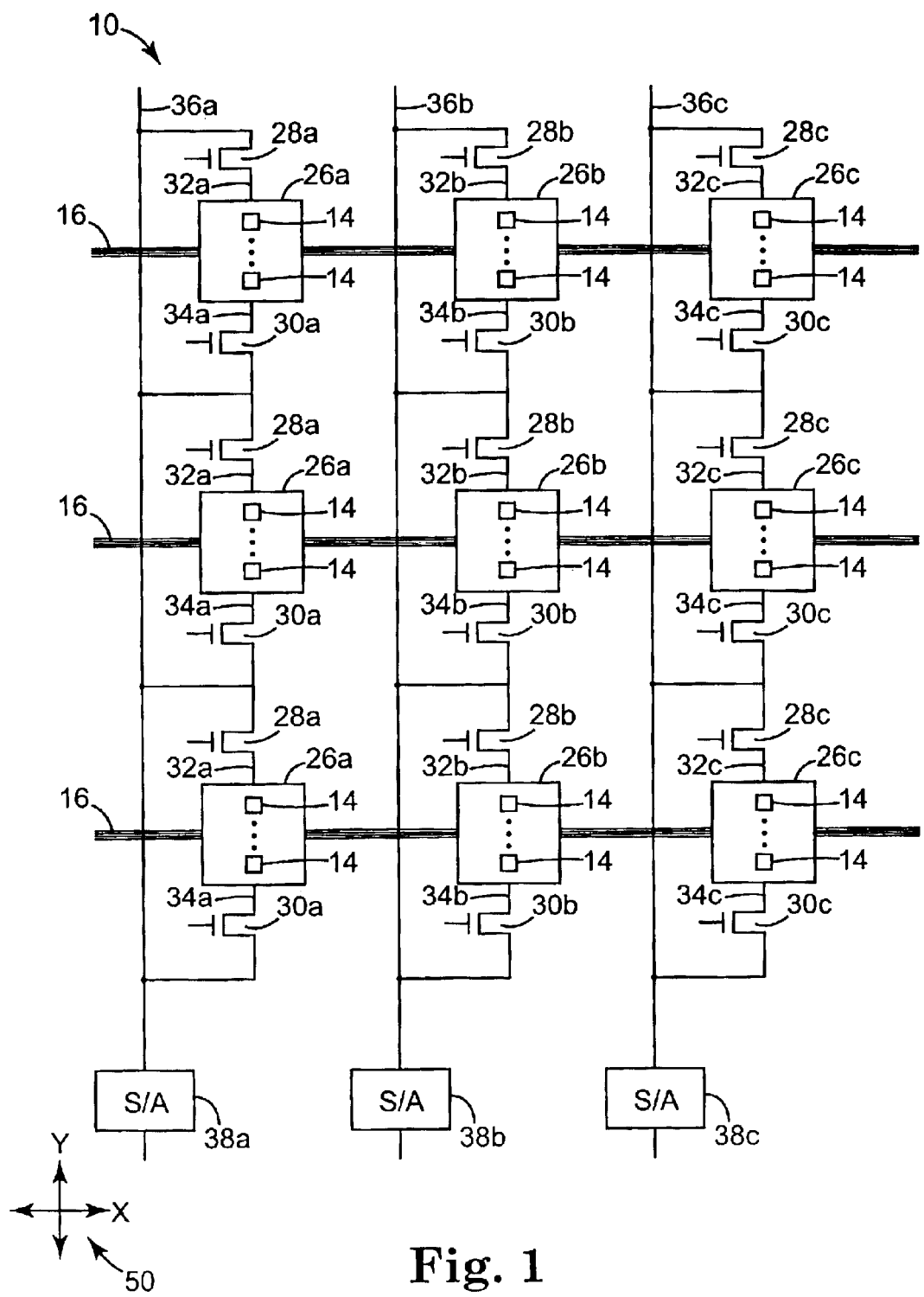
FIG. 1 is a diagram illustrating one exemplary embodiment of a memory storage device according to the present invention.

FIG. 1 is a diagram illustrating one exemplary embodiment of a memory storage device 10 according to the present invention. In the illustrated embodiment, an array of column line segment stacks 26 are illustrated which are each intersected by row lines 16. In the illustrated embodiment, row lines 16 each include at least two row lines which are substantially coplanar and parallel and extend in a dimension X, as indicated by arrows 50, to intersect the column line segment stacks 26. In other embodiments, the row lines 16 can each include any suitable number of individual row lines.

In the illustrated embodiment, three base column lines which extend in a dimension Y, perpendicular to the X dimension as indicated by arrows 50, are illustrated at 36a, 36b, and 36c. In other embodiments, there can be any suitable number of base column lines 36. Each base column line 36 is coupled to a corresponding sense amplifier 38 so that the corresponding sense amplifier 38 can read data from memory cells located in the corresponding column line segment stacks 26.

Each column line segment stack 26 includes at least two memory cells 14. Each of the memory cells 14 are intersected by a unique row line 16 within the row lines 16. The memory cells 14 within each column line segment stack 26 are coupled to either a corresponding line 32 or line 34. Switches 28 and 30 couple, respectively, corresponding conductive pillars or conductive vias 32 or 34 to base column line 36 so that the memory cells 14 within a selected column line segment stack 26 can be read by the corresponding sense amplifier 38. In one embodiment, switches 28 and 30 are implemented with transistors. In one embodiment, the transistors 28/30 are complementary metal oxide semiconductor (CMOS) transistors.

Figure 2:
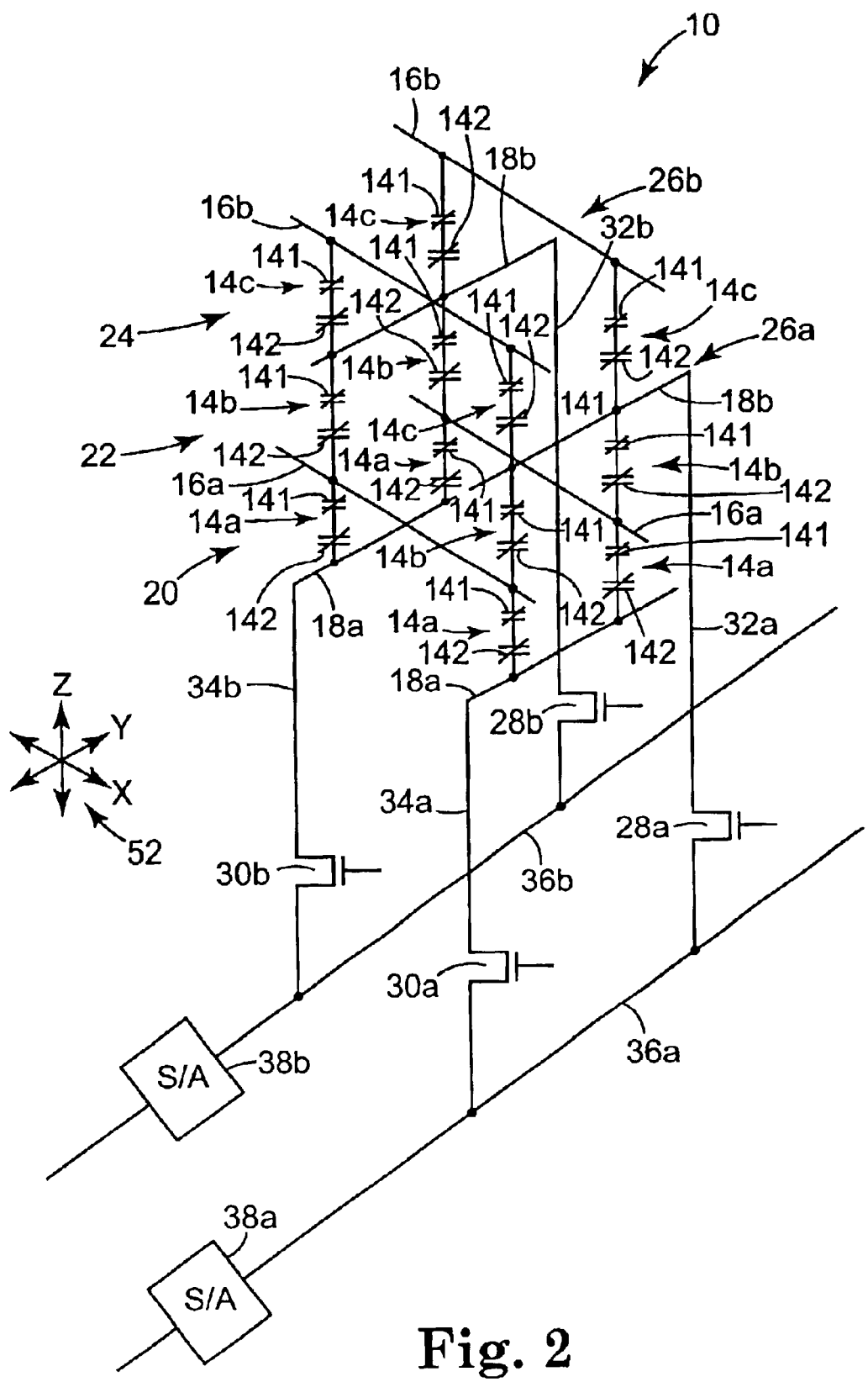
FIG. 2 is a schematic diagram illustrating one exemplary embodiment of a memory storage device having memory cells which include a storage element in series with a control element.

FIG. 2 is a schematic diagram illustrating one exemplary embodiment of a memory storage device having memory cells 14 which include a storage element 141 in series with a control element 142. In the illustrated embodiment, each memory cell 14 is coupled to corresponding base column lines 36 and sense amplifiers 38 through a corresponding switch 28 or switch 30. By selecting either switch 28 or switch 30, the state of each memory cell 14 within a column line segment stack 26 can be read by a corresponding sense amplifier 38.

In the illustrated embodiment, memory cells 14 are coupled between a row line 16 and a column line segment 18. The row lines 16a and 16b are illustrated at two levels wherein each row line 16 within a particular level are substantially coplanar and parallel and extend in the X dimension, as indicated by arrows 52. Row lines 16a are illustrated at a first level which is below the second level of row lines 16b. In the illustrated embodiment, column line segments 18 extend in the Y dimension which is perpendicular to the X dimension as indicated by arrows 52. The column line segments 18a and 18b are illustrated at two levels which are between and below row lines 16. Each column line segment 18 intersects at least one memory cell 14. The column line segments 18b are provided above column line segments 18a and are aligned with column line segments 18a.

In the illustrated embodiment, memory cells 14 are provided at three levels which are indicated at 20, 22 and 24 and are defined in a third dimension Z indicated by arrows 52. Memory cells 14a illustrated at level 20 are coupled between row lines 16a and column line segments 18a. Memory cells 14b illustrated at level 22 are coupled between column line segments 18b and row lines 16a. Memory cells 14c illustrated at level 24 are coupled between row lines 16b and column line segments 18b. In the illustrated embodiment, each column line segment 18 and row line 16 intersect a particular memory cell 14.

The illustrated embodiment is abbreviated to better illustrate the scope of the present invention. Those skilled in the art will appreciate that memory storage device 10 can be fabricated in other embodiments with any suitable number of levels extending in the Z dimension and with any suitable number of memory cells 14 per layer. In the other embodiments, there can be any suitable number of row lines 16 extending in the X dimension or column line segments 18 extending in the Y dimension.

In the illustrated embodiment, each column line segment 18 within a particular column line segment stack 26 is coupled to the corresponding switch 28 or switch 30. Adjacent column line segments 18a and 18b are not coupled to the same switch 28 or to the same switch 30 so that memory cells 14 coupled to a particular row line 16 can be individually selected via switch 28 or switch 30.

In the illustrated embodiment, each memory cell 14 includes storage element 141 in series with a control element 142. In one embodiment, the storage element 141 includes an anti-fuse element. In one embodiment, the control element 142 includes a tunnel junction control element. In one embodiment, the control element includes a diode.

In the illustrated embodiment, storage element 141 is programmed by applying a programming voltage across memory cell 14 to change the resistance of memory cell 14. In one embodiment, the storage element before being programmed is configured to indicate a first resistance value when a read voltage is applied across storage element 141 and control element 142. The storage element 141 after being programmed is configured to indicate a second resistance value when the read voltage is applied across the storage element 141 and control element 142. In one embodiment, the programming voltage is between one and three volts. In one embodiment, the read voltage is less than one volt. In one embodiment, the first resistance value is one megaohm or more. In one embodiment, the second resistance value is 100 kilohms or less. In one embodiment, the storage element is configured to be electrically nonconductive before being programmed and is configured to be electrically conductive after being programmed. In one embodiment, memory cells 14 are formed of an electrically resistive material which is configured to indicate a resistance value when the read voltage is applied across memory cell 14. In other embodiments, each memory cell 14 includes a resistor in series with the control element.

In the illustrated embodiment, the resistance state of a selected memory cell 14 is determined by applying a read voltage across memory cell 14 and measuring the current that flows through memory cell 14. During a read operation to determine the state or resistance value of a selected memory cell 14, a row decoder (not shown) selects a row line 16 by coupling the row line 16 to a voltage potential, hereinafter referred to as V+. All unselected row lines 16 are coupled to a virtual ground voltage, hereinafter referred to as Va. The gate of transistor 28 or transistor 30 corresponding to the column line segment 18 and base column line 36 of the selected memory cell 14 have a positive voltage applied to couple the corresponding column line segment 18 to the corresponding base column line 36. During the read operation, sense amplifiers 38 hold base column lines 36 at the voltage potential Va. Since the selected memory cell 14 is coupled between the column line segment 18 which is at voltage Va and the selected row line 16 which is at voltage V+, a sense current is conducted through memory cell 14 and the corresponding base conductor line 36 to the corresponding sense amplifier 38. The sense amplifier 38 is configured to provide the state of the selected memory cell 14 based on the conducted current.

In the illustrated embodiment, the unselected row lines 16 and the selected base column line 36 and column line segment 18 are held at the voltage Va during the read operation to limit unintended leakage currents from being coupled to the sense amplifiers 38 during the read operation. In various embodiments, the number of column line segments 18 within a particular column line segment stack 26, as well as the number of memory cells 14 coupled to the particular column line segment 18, are optimized to limit the leakage currents coupled to sense amplifier 38 during the read operation.

Figure 3:
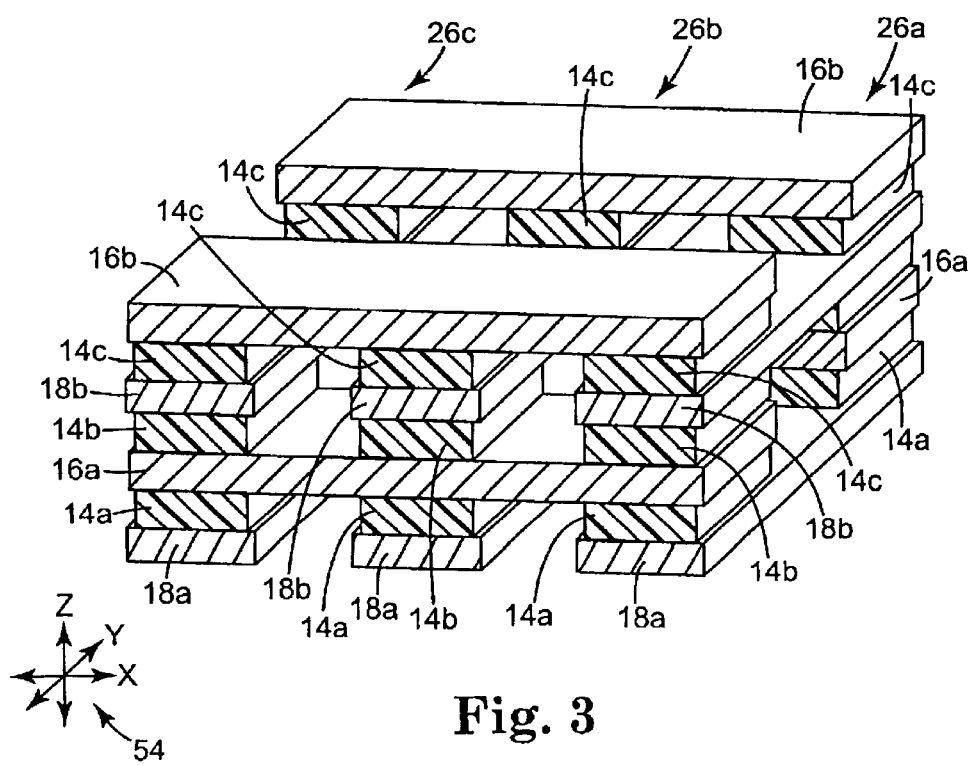
FIG. 3 is a perspective view illustrating one exemplary embodiment of the column line segment stacks.

FIG. 3 is a perspective view illustrating one exemplary embodiment of the column line segment stacks 26. FIG. 3 illustrates three column line segment stacks at 26a, 26b and 26c. Row lines 16a and 16b each are an array of conductors formed of a conductive material which intersects either a top side or a bottom side of memory cells 14. Column line segments 18a and 18b each are an array of conductors and are formed of a conductive material which intersects either a top side or a bottom side of memory cells 14. FIG. 3 illustrates that each memory cell 14 is intersected by one row line 16 and one column line segment 18. In other embodiments, other suitable arrangements of column line segments 18 and row lines 16 with corresponding memory cells 14 may be used within the scope of the present invention.

Figure 4A:
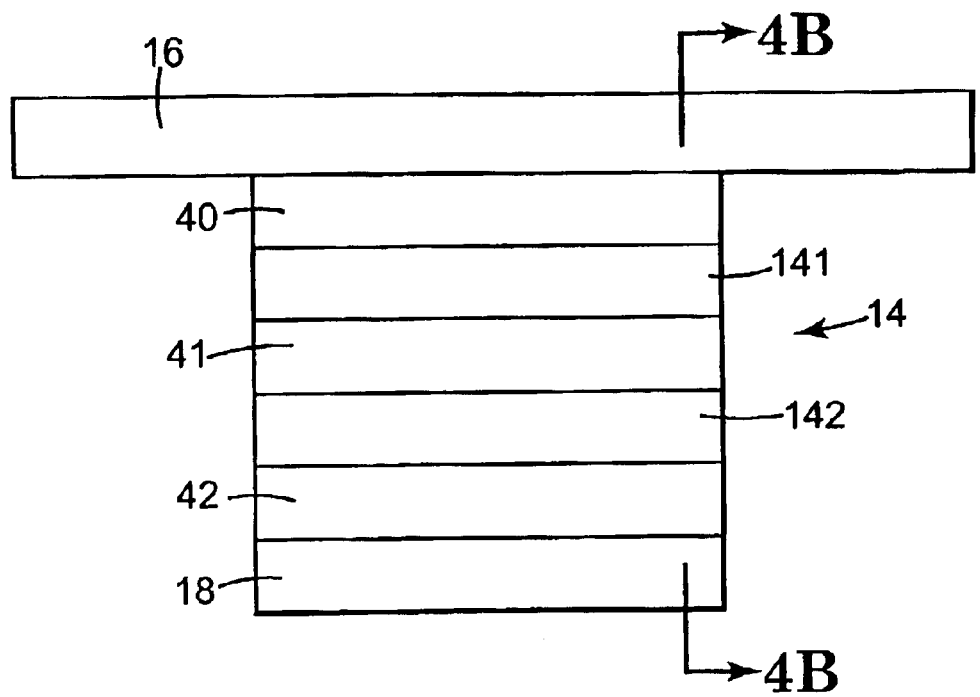
FIGS. 4A and 4B are cross section views illustrating a first embodiment of a memory cell used in a memory storage device according to the present invention.
Figure 4B:
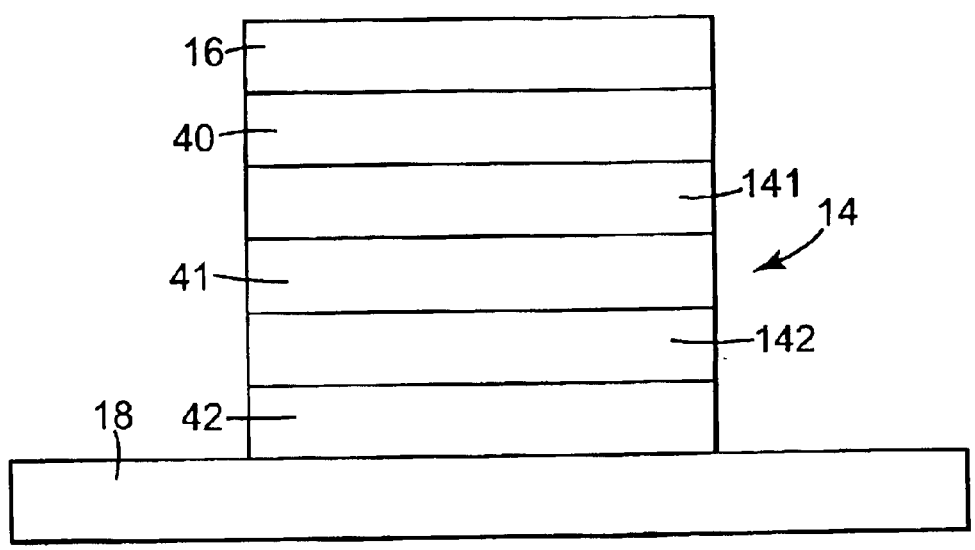

FIGS. 4A and 4B are cross section views illustrating a first embodiment of a memory cell 14 used in a memory storage device according to the present invention. FIGS. 4A and 4B illustrate that each memory cell 14 is intersected and electrically coupled to a row line 16 and a column line segment 18. Memory cells in various embodiments are electrically coupled at a top side to column line segment 18 and at a bottom side to row lines 16, or at a bottom side to column line segments 18 and at a top side to row lines 16.

FIG. 4A illustrates a tunnel junction storage element 141 electrically coupled via electrode 41 to a tunnel junction control element 142. Control element 142 is electrically coupled to column line segments 18 via electrode 42. Storage element 141 is electrically coupled to row line 16 via electrode 40. Electrodes 40, 41 and 42 provide a low resistance contact to control element 142 and storage element 141 to minimize any unintended resistance to current flow through memory cell 14. In other embodiments, electrodes 40, 41 or 42 are not used.

FIG. 4B illustrates a cross section of FIG. 4A along lines 4B—4B to illustrate that row line 16 extends in a first dimension and column line segment 18 extends in a second dimension, wherein the first dimension and the second dimension in the illustrated embodiment are perpendicular. In other embodiments, row lines 16 and column line segments 18 are not perpendicular. In various embodiments, the process illustrated in FIG. 4 is repeated to stack multiple layers to form the column line segment stacks 26.

Figure 5:
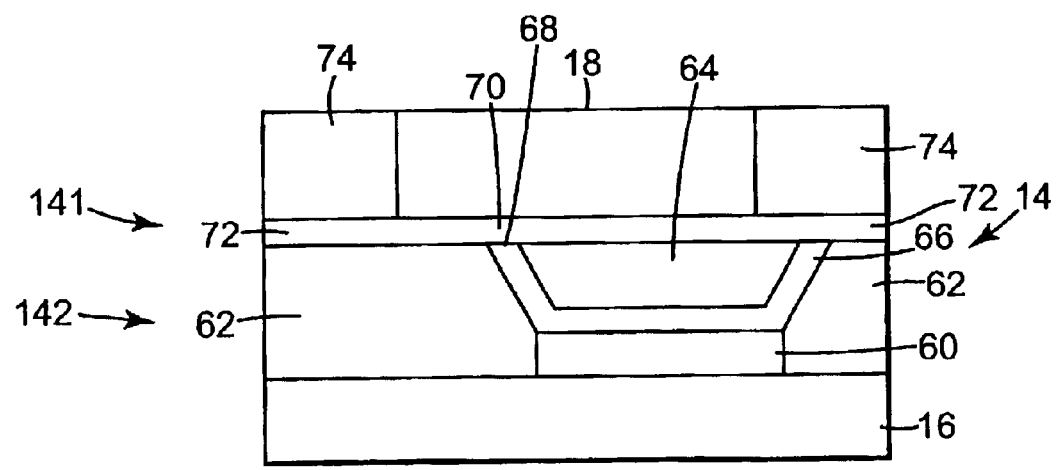
FIG. 5 is a cross section view illustrating a second embodiment of a memory cell used in a memory storage device according to the present invention.

FIG. 5 is a cross section view illustrating a second embodiment of a memory cell 14 used in a memory storage device according to the present invention. In the illustrated embodiment, a row line 16 is formed of a conductive thin-film such as aluminum and is deposited and etched to define row line 16. A planar dielectric layer 62 is formed over and above row line 16.

In the illustrated embodiment, after dielectric layer 62 has been formed, an etch step is completed to define an etched via region 64. The exposed row line 16 in the bottom of via region 64 is oxidized to form an oxide portion 60. In various embodiments, oxide portion 60 is formed through self-oxidation, is thermally grown, or is deposited. In one embodiment, oxide portion 60 has a thickness which is less than 100 Angstroms. In other embodiments, oxide portion 60 has a thickness which is less than 50 Angstroms. After oxide portion 60 is formed, a conductive thin-film metal layer 66 is deposited over dielectric layer 62 and a dielectric layer is completed to fill the open etched via region 64. A CMP step is completed to remove portions of metal layer 66 to define an exposed edge 68. An oxide layer 72 which includes a portion 70 overlying the exposed edge 68 is next formed over the planarized surface. A conductive thin-film is deposited and etched to define column line segment 18 and a dielectric filler layer 74 is formed over and above column line 18. In various embodiments, the process illustrated in FIG. 5 is repeated to stack multiple layers to form the column line segment stacks 26.

In various embodiments, row line 16 and column line segment 18 are formed of aluminum, copper, silicide or alloys, or other suitable conductive metals or semiconductor materials. In various embodiments, oxide layer 72 is formed of any suitable electrically insulative material which includes, but is not limited to, oxide-nitride-oxide (ONO), tantalum pentoxide ($Ta_2O_5$), plasma enhanced silicon nitride (P-$SiN_x$), titanium oxide, germanium oxide, any chemical vapor deposition (CVD) dielectric including a deposited oxide, a grown oxide, or any other suitable dielectric material. In various embodiments, dielectric layer 62 and dielectric layer 74 are formed of suitable electrically insulative materials which include, but are not limited to, a wet or dry silicon dioxide ($SiO_2$), a nitride material including silicon nitride, tetraethylorthosilicate (Si—$OC_2H_5$), TEOS based oxides including oxides formed by a deposition resulting from the decomposition of a TEOS gas in a reactor, borophosphosilicate glass (BPSG), phosphosilicate glass (PSG), borosilicate glass (BSG), polyamide film, oxynitride, spin on glass (SOG), any chemical vapor deposited (CVD) dielectric including a deposited oxide or a grown oxide, any physical vapor deposition (PVD) dielectric, or a sputtered dielectric.

In the illustrated embodiment, row line 16, oxide portion 60 and metal layer 66 form the control element 142. In the illustrated embodiment, metal layer 66, oxide portion 70 and column line segment 18 form the storage element 141. Storage element 141 utilizes electron tunneling to create the storage structure. In the illustrated embodiment, the electron tunneling can be direct tunneling thereby requiring a minimal oxide layer thickness. In various embodiments, the oxide layer thickness is within a range of approximately 5 to 50 Angstroms. In other embodiments, other suitable oxide layer thicknesses can be used. In one embodiment, storage element 141 is an anti-fuse element. In other embodiments, storage element 141 utilizes mechanisms such as dielectric rupture dynamics to create the storage structure.

In various embodiments, when a low voltage potential is present across oxide portion 70 such as when reading the memory cell, the current through oxide portion 70 can be in the low microampere or nanoampere range, thereby resulting in low power dissipation. When storage element 141 is programmed by creating filaments through oxide portion 70, the current can be in the high nanoampere to microamp range. This difference in current levels creates a very good signal to noise ratio for sensing whether the oxide portion 70 is programmed to have a logical "0" or a logical "1" state. While the illustrated current ranges are approximate current ranges for 0.18 micron process geometries, the actual current ranges can vary in accordance with the actual process geometries used.

In various embodiments, at higher voltage potentials, such as when programming storage element 141, the oxide portion 70 can have higher current flow as a result of tunneling current. The tunneling current creates a flow of electrons that locally heat storage element 141, thereby forming conductive filaments through oxide portion 70. The conductive filaments are formed when sufficient energy is forced across the oxide portion 70 barrier to heat the fusing site, resulting in the state of the oxide portion 70 being changed permanently. In other embodiments, the oxide portion 70 can be processed to be a dielectric breakdown device rather than a tunnel junction device.

Figure 6:
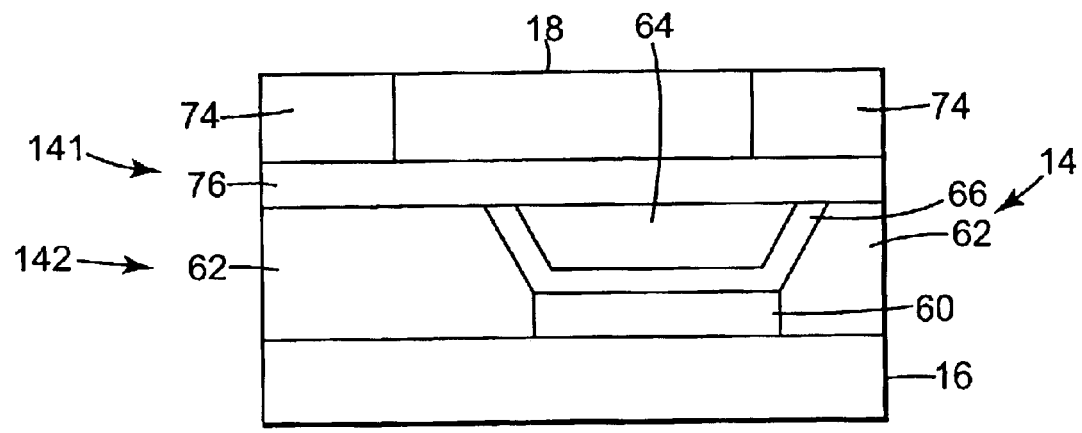
FIG. 6 is a cross section view illustrating a third embodiment of a memory cell used in a memory storage device according to the present invention.

FIG. 6 is a cross section view illustrating a third embodiment of a memory cell 14 used in a memory storage device according to the present invention. The construction of memory cell 14 is similar to the embodiment of FIG. 5 with the exception that the illustration in FIG. 6 includes a state-change layer 76. Many suitable phase-change materials can be used for a read/writeable (or write/erase/write) state-change layer in accordance with the present invention. In one embodiment, germanium telluride (GeTe) is used. GeTe can be reversibly changed from a semiconducting (amorphous) state to a metallic (crystalline) state by undergoing heating and cooling steps at a suitable rate. In one embodiment, the GeTe is doped so that it is p-type when in its semiconducting state. When GeTe is deposited over an n-type semiconductor layer, a large contrast is observed in the number of carriers swept across the junction when compared to GeTe in the metallic state. In various embodiments, when using GeTe or other suitable phase-change materials, the memory cell is read-writeable or capable of being written, erased, and written. In other embodiments, other phase-change materials can be used which include, but are not limited to, chalcogenide alloys such as GaSb, InSb, InSe, $Sb_2Te_3$, $Ge_2Sb_2Te_5$, InSbTe, GaSeTe, $SnSb_2Te_4$, InSbGe, AgInSbTe, (GeSn)SbTe, GeSb (SeTe), $Te_{81}Ge_{15}Sb_2S_2$ and GeSbTe.

In other embodiments, alternative state-change technologies can be used to construct memory cell 14. These technologies include, but are not limited to, a LeComber switch or a silicide switch. The LeComber switch is formed by depositing a thin layer of amorphous intrinsic silicon over a metallic conductor such as row line 16 or column line segment 18. The conductor can be formed by a number of suitable materials which include Chromium (Cr). After the thin layer of amorphous intrinsic silicon is deposited, a separate metal such as gold (Ag) is deposited over the layer of amorphous intrinsic silicon. The LeComber switch performs as a reversed biased tunnel diode before being programmed. The LeComber switch is programmed by creating an enhanced concentrated electric field through the amorphous silicon to form a conductive path.

The silicide switch is formed by stacking alternating silicon and transition metal thin films so that the alternating films exhibit a changed resistance when programmed. Generally, the programming process for a silicide switch is irreversible. Before writing, the stacked silicon and transaction metal layers have a first resistance. Appropriate row and column lines are selected to force a current through a selected memory cell. The current passing through the selected memory cell creates Joule heat which triggers and completes the silicidation reaction. By applying a concentrated electric field, the current is focused and the Joule heat is concentrated in a small area which allows the programming to be completed. The silicidation reaction causes the resistance of the selected memory cell to change to a lower value. To read the programmed memory cell, a small sense current is supplied to the memory cell and the voltage drop across the memory cell is measured. In various embodiments, many suitable silicide compounds can be used which include, but are not limited to, $Ni_2Si$, NiSi, $NiSi_2$, Pd2Si, PdSi, and $Pt_2Si$, and PtSi. In other embodiments, other transition metals in various compounds with silicon can be used which include, but are not limited to, Ti, V, Cr, Mn, Fe, Co, Zr, Nb, Mo, Rh, Hf, Ta, W, and Ir. In various embodiments, the process illustrated in FIG. 6 is repeated to stack multiple layers to form the column line segment stacks 26.

Figure 7:
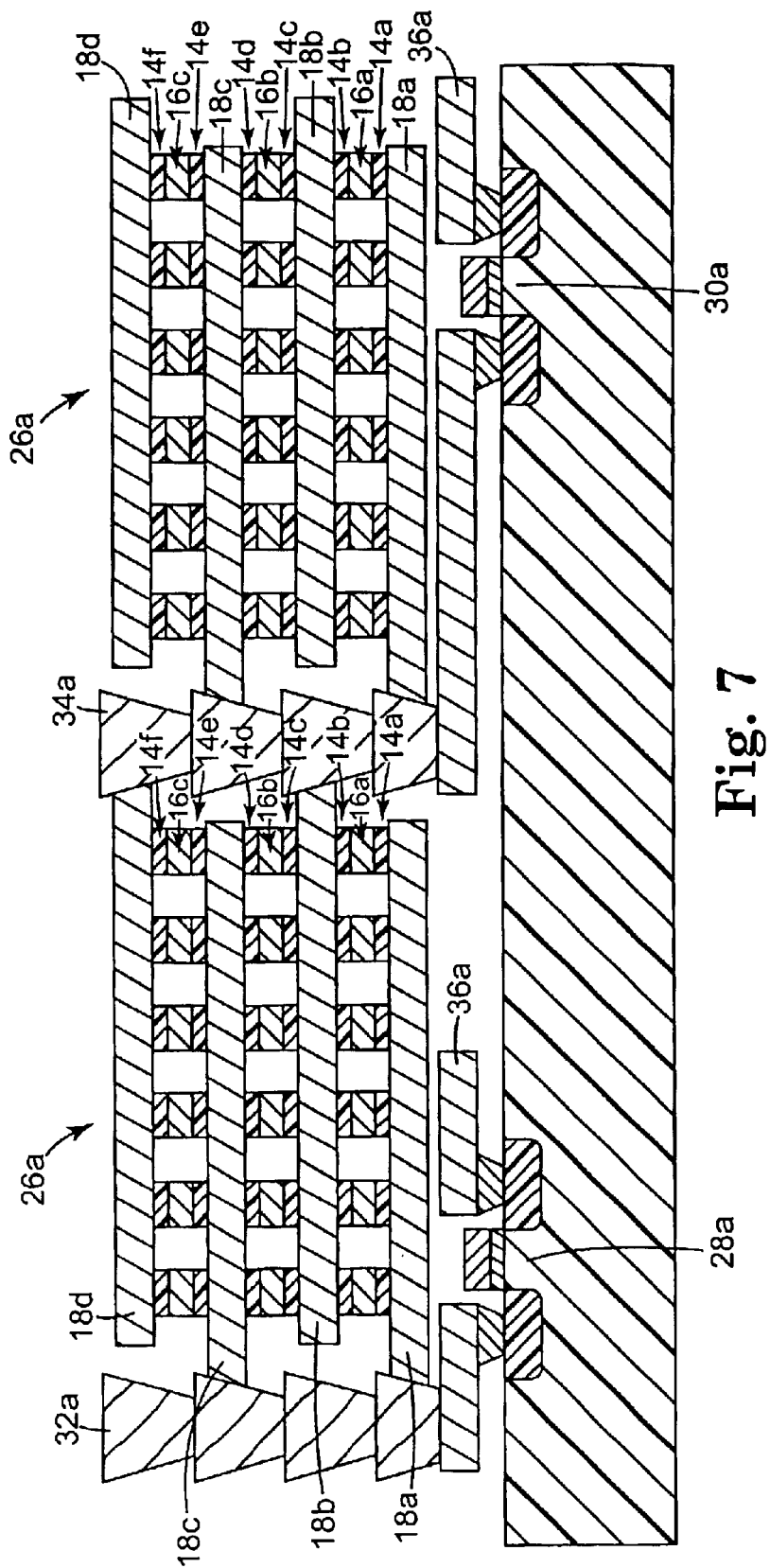
FIG. 7 is a cross section view illustrating a first exemplary embodiment of the column line segment stacks.

FIG. 7 is a cross section view illustrating a first exemplary embodiment of a column line segment stack 26. FIG. 7 illustrates two column line segment stacks 26a corresponding to a base conductor line illustrated at 36a. Row lines 16 extend in a first dimension and are illustrated at 16a through 16c. Column line segments 18 extend in a second dimension and are illustrated at 18a through 18d. Memory cell arrays 14a through 14f intersect column line segments 18a through 18d such that each column line segment 18 intersects at least one memory cell 14. Each memory cell 14 is intersected by a unique row line 16. In the illustrated embodiment, conductive pillars or conductive vias 32a and 34a are coupled to column line segments 18 so that each column line segment 18 intersects memory cells 14 which do not intersect the same row line 16. The interconnection arrangement of row lines 16, column line segments 18 and memory cells 14 allow each memory cell 14 to be intersected by a unique row line 16 and column line segment 18 and be selected through the corresponding select switch 28a or select switch 30a.

Figure 8:
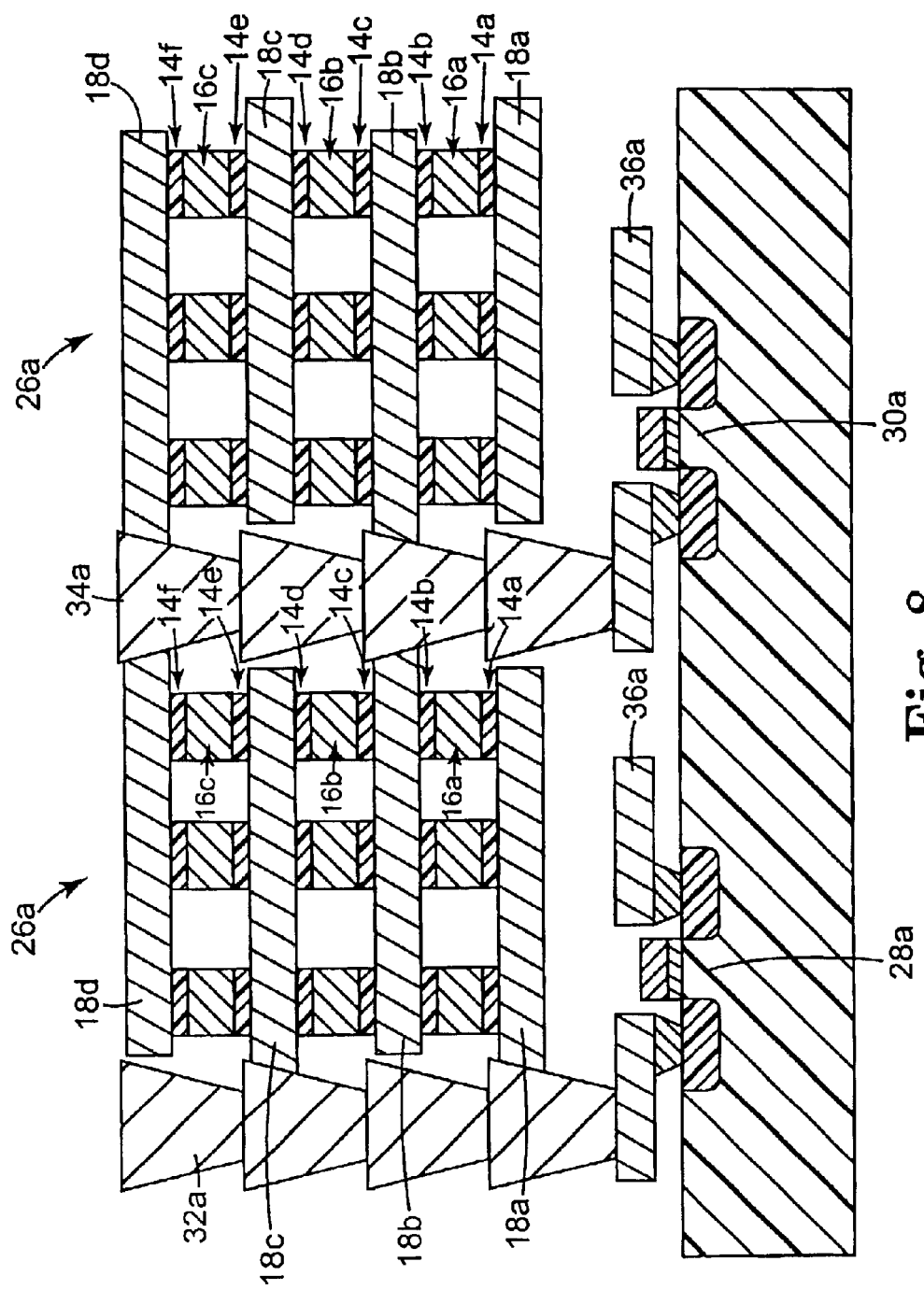
FIG. 8 is a cross section view illustrating a second exemplary embodiment of the column line segment stacks.

FIG. 8 is a cross section view illustrating a second exemplary embodiment of a column line segment stack 26. FIG. 8 illustrates an interconnection arrangement for column line segment stacks 26a which is similar to the embodiment of FIG. 7 with the difference being that each column line segment 18 intersects three memory cells 14, wherein in the embodiment illustrated in FIG. 7, each column line segment 18 intersects six memory cells 14. In the embodiment illustrated in FIG. 8, smaller amounts of unintended leakage currents are coupled through select switches 28a or 30a to sense amplifiers 38 during the read operation, because each column line segment 18 intersects three rather than the six memory cells 14 illustrated in FIG. 7. In other embodiments, other suitable numbers of column line segments 18 may be used. While the embodiments illustrated in FIGS. 7 and 8 illustrate respectively six memory cells 14 and three memory cells 14 intersecting a single column line segment 18 in other embodiments, other suitable numbers of memory cells can intersect each column line segment 18, depending on the level of leakage currents which can be tolerated.

Figure 9:
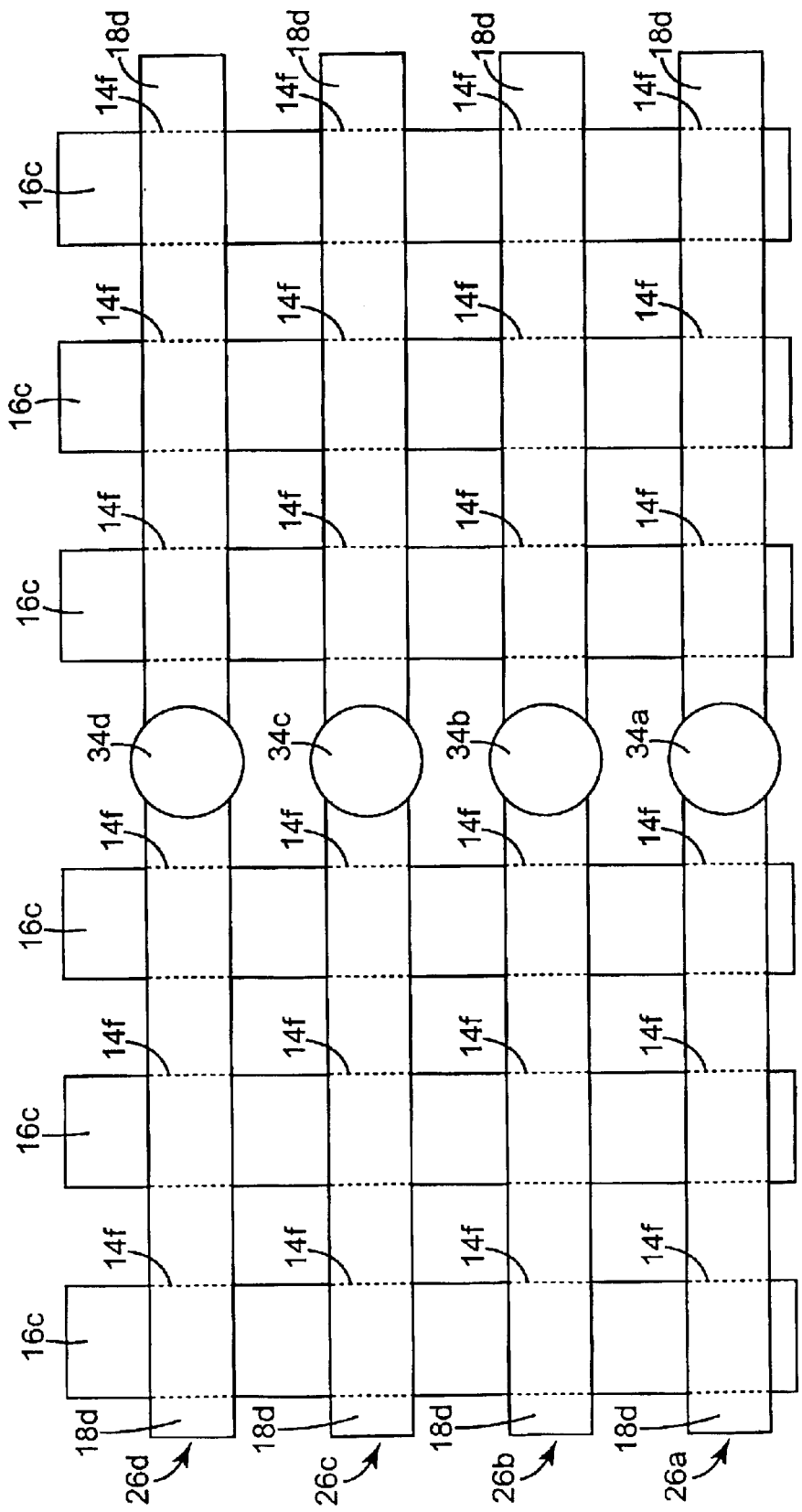
FIG. 9 is a top plan view of the second exemplary embodiment illustrated in FIG. 8.

FIG. 9 is a top plan view of the second exemplary embodiment illustrated in FIG. 8. FIG. 9 illustrates column line segment stacks 26a through 26d wherein conductive pillars or conductive vias 34 couple column line segments 18 to adjacent column line segments 18 between column line segment stacks 26. Each column line segment stack 26 includes three row conductors 16c which are perpendicular to the column line 18d. Column line segments 18d are aligned with corresponding column line segments 18a through 18c. Each memory cell 14f is intersected by a row line 16 and a column line segment 18.

Figure 10:
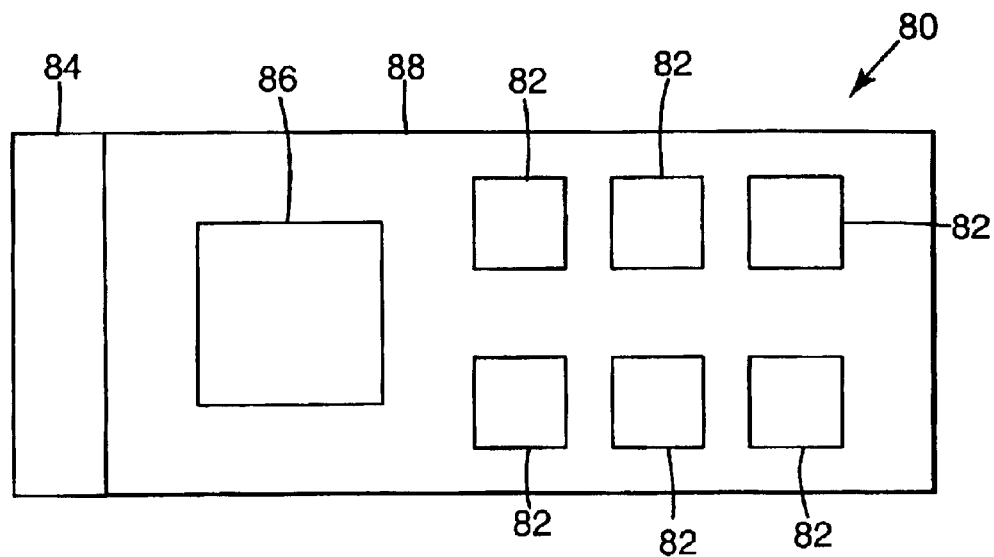
FIG. 10 is a layout view of a memory carrier in accordance with the present invention which incorporates the three dimensional memory storage device illustrated and described above.

FIG. 10 is a layout view of a memory carrier 80 in accordance with the present invention which incorporates the three dimensional memory storage device illustrated and described above. In the illustrated embodiment, memory carrier 80 includes one or more memory storage devices 82. In various embodiments, memory carrier 80 can use any suitable memory card format which includes, but is not limited to, PCMCIA, PC card, smart memory, secure digital (SD), multi-media card (MMC), memory stick, digital film, ATA, and compact flash. In the illustrated embodiment, memory carrier 80 includes a mechanical interface 84 that provides for both mechanical and electrical contact with a connector suitable for memory carrier 80. In another embodiment, an electrical interface 86 electrically couples with electrical contacts on mechanical interface 84 and provides suitable functions which include security, address decoding, voltage translation or write protection for memory storage devices 82. In various embodiments, memory carrier 80 can be a printed circuit board or ceramic substrate which physically supports memory storage devices 82, electrical interface 86 and mechanical interface 84.

Figure 11:
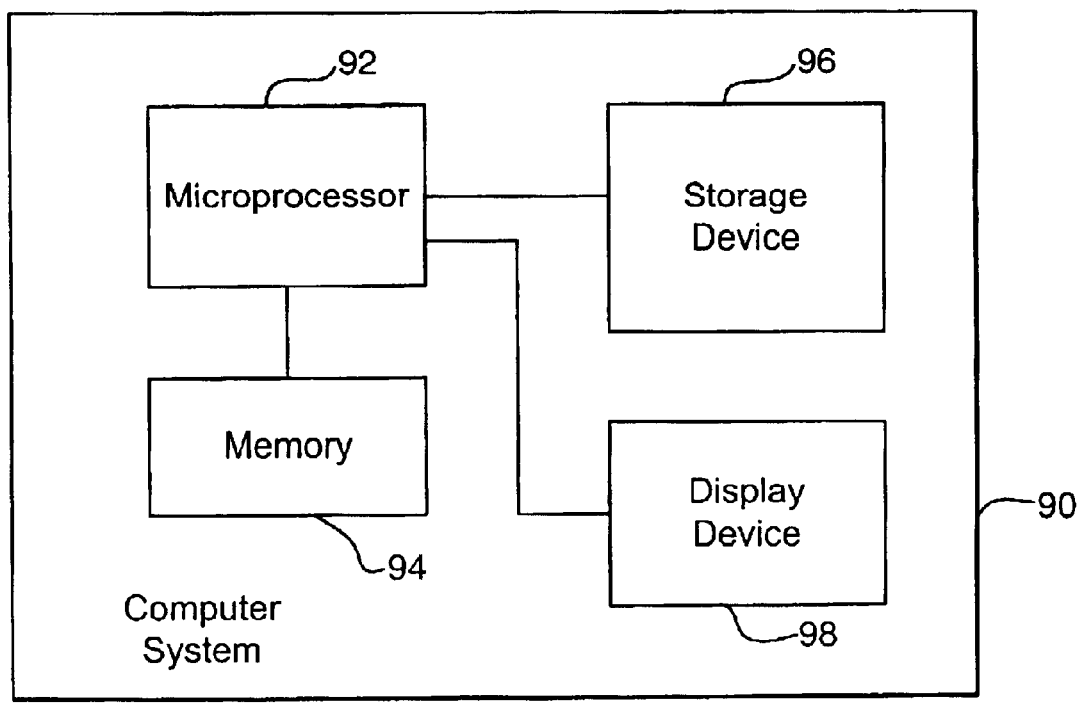
FIG. 11 is a block diagram of an electronic device in accordance with the present invention which incorporates the three dimensional memory storage device illustrated and described above.

FIG. 11 is a block diagram of an electronic device in accordance with the present invention which incorporates the three dimensional memory storage device illustrated and described above. In the embodiment illustrated in FIG. 11, the electronic device is a computer system 90. In the illustrated embodiment, a microprocessor 92 is coupled to a memory storage device 94. In various embodiments, memory storage device 94 is used to hold computer executable instructions and/or user data. Other applications for memory storage device 94 can include BIOS memory, DRAM memory, ROM, or various levels of internal or external cache memory. In the illustrated embodiment, microprocessor 92 is connected to a storage device 96 which can be a hard disk drive, floppy drive, CD/DVD drive, tape drive or other suitable mass storage device. Both microprocessor 92 and memory circuit 94 can include one or more memory storage devices according to the present invention. In the illustrated embodiment, microprocessor 92 is connected to a display device 98 that can include memory storage devices according to the present invention. In various embodiments, the memory storage device of the present invention can be included within many memory storage application areas within computer system 90.

Figure 12:
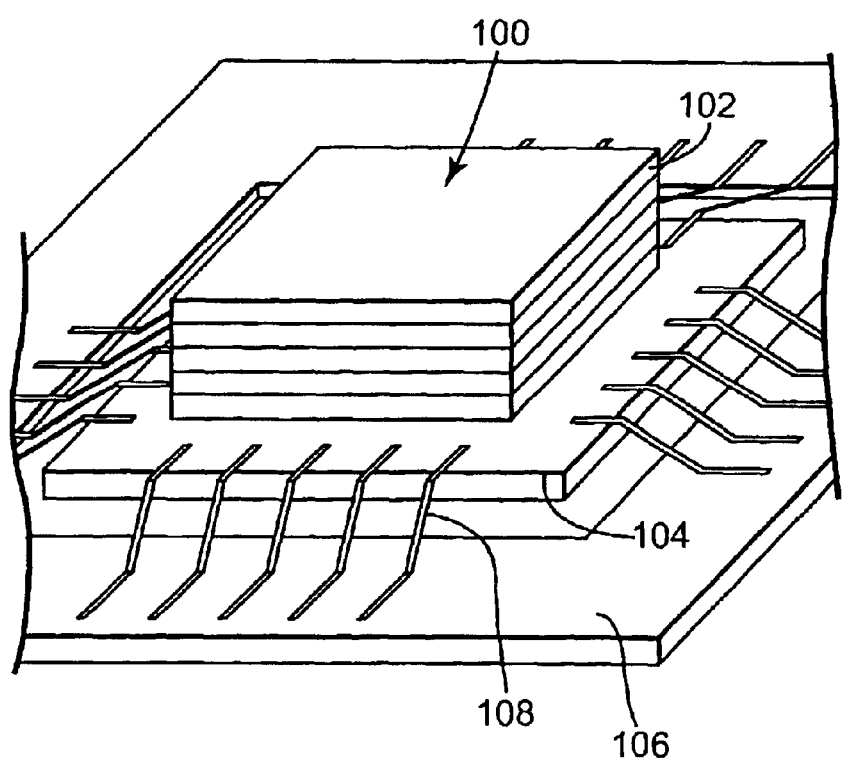
FIG. 12 is a partial perspective view of an embedded memory array in accordance with the present invention which incorporates the three dimensional memory storage device illustrated and described above.

FIG. 12 is a partial perspective view of an embedded memory array 100 in accordance with the present invention which incorporates the three dimensional memory storage device illustrated and described above. In the illustrated embodiment, embedded memory array 100 is fabricated on top of a microprocessor 104 to minimize the die area size. Microprocessor 104 forms a horizontal substrate surface. Preferably, memory array 100 is built of one or more vertical layers 102 of memory cells 14 to form the embedded memory array 100. Microprocessor 102 is electrically attached to a package 106 via bonding wires 108. In other embodiments, other suitable packaging technologies such as Tape Automated Bonding (TAB) can be used.

Although specific embodiments have been illustrated and described herein for purposes of description of the preferred embodiment, it will be appreciated by those of ordinary skill in the art that a wide variety of alternate and/or equivalent implementations may be substituted for the specific embodiments shown and described without departing from the scope of the present invention. Those with skill in the chemical, mechanical, electromechanical, electrical, and computer arts will readily appreciate that the present invention may be implemented in a very wide variety of embodiments. This application is intended to cover any adaptations or variations of the preferred embodiments discussed herein. Therefore, it is manifestly intended that this invention be limited only by the claims and the equivalents thereof.

What is claimed is:

1. A memory storage device, comprising:
   a first and second memory cell each having a top end and a bottom end;
   a first and second first dimension conductor, wherein the first and second first dimension conductors are substantially coplanar and parallel and extend in a first dimension, wherein the first first dimension conductor intersects the bottom end of the first memory cell and the second first dimension conductor intersects the top end of the second memory cell;
   a first second dimension conductor which extends in a second dimension and intersects the top end of the first memory cell;
   a second second dimension conductor which extends in the second dimension and intersects the bottom end of the second memory cell; and
   a first third dimension conductor which extends in a third dimension and is positioned between the first and second memory cell to couple the first second dimension conductor to the second second dimension conductor.

2. The memory storage device of claim 1, further comprising:
   a first base conductor which extends in the second dimension; and
   a first select switch coupled between the first third dimension conductor and the first base conductor, wherein the first select switch is configured to conduct a sense current from the first memory cell or the second memory cell to the first base conductor.

3. The memory storage device of claim 2, further comprising:
   a third and fourth memory cell each having a top end and a bottom end, wherein the second first dimension conductor intersects the bottom end of the third memory cell;
   a third first dimension conductor which extends in the first dimension, wherein the third first dimension conductor is positioned to be adjacent to the second first dimension conductor and not between the first first dimension conductor and the second first dimension conductor, wherein the third first dimension conductor is substantially coplanar with and parallel to the first and second first dimension conductors, wherein the third first dimension conductor intersects the top end of the fourth memory cell;
   a third second dimension conductor which extends in the second dimension, wherein the third second dimension conductor is substantially coplanar with the first second dimension conductor and intersects the top end of the third memory cell;
   a fourth second dimension conductor which extends in the second dimension, wherein the fourth second dimension conductor is substantially coplanar with the second second dimension conductor and intersects the bottom end of the fourth memory cell;

a second third dimension conductor extends in a third dimension and is positioned between the third and fourth memory cells to couple the third second dimension conductor to the fourth second dimension conductor; and a second select switch coupled between the second third dimension conductor and the first base conductor, wherein the second select switch is configured to conduct a sense current from the third memory cell or the fourth memory cell to the first base conductor.

4. The memory storage device of claim 3, wherein the first and second select switches are first and second transistors.

5. The memory storage device of claim 4, wherein the first and second transistors are complementary metal-oxide semiconductor transistors.

6. The memory storage device of claim 3, wherein each memory cell includes a storage element in series with a control element.

7. The memory storage device of claim 6, wherein the storage element includes a tunnel junction device.

8. The memory storage device of claim 6, wherein the storage element includes a silicide switch.

9. The memory storage device of claim 6, wherein the storage element includes a LeCombre switch device.

10. The memory storage device of claim 6, wherein the storage element includes a rewriteable phase-change material.

11. The memory storage device of claim 6, wherein the storage element includes an anti-fuse device.

12. The memory storage device of claim 6, wherein the control element includes a tunnel junction device.

13. The memory storage device of claim 6, wherein the control element includes a diode.

14. The memory storage device of claim 6, wherein the storage element before being programmed is configured to indicate a first resistance value when a read voltage is applied across the storage element and the corresponding control element, and wherein the storage element after being programmed is configured to indicate a second resistance value when the read voltage is applied across the storage element and the corresponding control element.

15. The memory storage device of claim 6, wherein the storage element is configured to be electrically non-conductive before being programmed and is configured to be electrically conductive after being programmed.

16. The memory storage device of claim 3, wherein each memory cell includes a memory element formed with an electrically resistive material which is configured to indicate a resistance value when a read voltage is applied across the memory cell.

17. The memory storage device of claim 3, wherein each memory cell includes a resistor in series with a control element.

18. A memory array, comprising:

a first row line array extending in a first dimension;

at least two first column line segments, each disposed below the first row line array and lying along an axis which extends in a second dimension;

at least two first memory cells, wherein each first column line segment intersects at least one first memory cell and each first memory cell is intersected by a unique first row line of the first row line array;

at least two second column line segments, each disposed above the first row line array and aligned with corresponding first column line segments;

at least two second memory cells, wherein each second column line segment intersects at least one second memory cell and each second memory cell is intersected by the unique first row line of the first row line array; and at least three conductive pillars, wherein each of the second column line segments is coupled to a pillar and the corresponding first column line segment is coupled to another pillar.

19. The memory array of claim 18, further comprising:

a second row line array extending in the first dimension, wherein the second row line array is disposed above the second column line segments and is substantially parallel to the first row line array; and at least two third memory cells, wherein each of the second column line segments intersects at least one third memory cell and each third memory cell is intersected by a unique second row line.

20. The memory array of claim 19, further comprising:

at least two third column line segments, each disposed above the second row line array and aligned with corresponding first and second column line segments, wherein each third column line segment is coupled to a same another pillar as the corresponding first column line segment; and at least two fourth memory cells, wherein each third column line segment intersects at least one fourth memory cell and each fourth memory cell is intersected by the unique second row line.

21. The memory array of claim 20, further comprising:

a third row line array extending in the first dimension, wherein the third row line array is disposed above the third column line segments and is substantially parallel to the first and second row line arrays; and at least two fifth memory cells, wherein each of the third column line segments intersects at least one fifth memory cell and each fifth memory cell is intersected by a unique third row line.

22. The memory array of claim 21, further comprising:

at least two fourth column line segments, each disposed above the third row line array and aligned with corresponding first, second and third column line segments, wherein each fourth column line segment is coupled to the same pillar as the corresponding second column line segment; and at least two sixth memory cells, wherein each fourth column line segment intersects at least one sixth memory cell and each sixth memory cell is intersected by the unique third row line.

23. The memory array of claim 22, further comprising:

a base column line extending in the second dimension; and at least three select switches, wherein each select switch is coupled to a unique one of the at least three pillars and is configured to conduct a sense current from at least one first, second, third, fourth, fifth or sixth memory cells to the base column line.

24. The memory array of claim 23, wherein each of the select switches is a transistor coupled between the unique one of the at least three pillars and the base conductor.

25. The memory array of claim 24, wherein the transistors are complementary metal-oxide semiconductor transistors.

26. The memory array of claim 22, wherein each memory cell includes a storage element in series with a control element.

27. The memory array of claim 26, wherein the storage element includes a tunnel junction device.

28. The memory array of claim 26, wherein the storage element includes a silicide switch.

29. The memory array of claim 26, wherein the storage element includes a LeCombre switch device.

30. The memory array of claim 26, wherein the storage element includes a rewriteable phase-change material.

31. The memory array of claim 26, wherein the storage element includes an anti-fuse device.

32. The memory array of claim 26, wherein the control element includes a tunnel junction device.

33. The memory array of claim 26, wherein the control element includes a diode.

34. The memory array of claim 26, wherein the storage element before being programmed is configured to indicate a first resistance value when a read voltage is applied across the storage element and the corresponding control element, and wherein the storage element after being programmed is configured to indicate a second resistance value when the read voltage is applied across the storage element and the corresponding control element.

35. The memory array of claim 26, wherein the storage element is configured to be electrically non-conductive before being programmed and is configured to be electrically conductive after being programmed.

36. The memory array of claim 26, wherein each memory cell includes a memory element formed with an electrically resistive material which is configured to indicate a resistance value when a read voltage is applied across the memory cell.

37. The memory array of claim 22, wherein each memory cell includes a resistor in series with a control element.

38. A memory storage device, comprising:
   a memory cell array;
   a row line array extending in a first dimension, wherein the row line array intersects the memory cell array;
   a segmented column line array extending in a second dimension, wherein each segmented column line includes at least two column lines, wherein the segmented column line array intersects the memory cell array so that each column line intersects at least one memory cell;
   a conductive pillar array, wherein each conductive pillar is coupled to one column line;
   a base column line array extending in the second dimension, wherein each base column line corresponds to a segmented column line; and
   a select switch array, wherein each select switch is coupled between a pillar and the corresponding base column line and is configured to conduct a sense current from the at least one memory cell to the corresponding base column line.

39. The memory storage device of claim 38, wherein each of the select switches is a transistor.

40. The memory storage device of claim 39, wherein the transistors are complementary metal-oxide semiconductor transistors.

41. The memory storage device of claim 38, wherein each memory cell includes a storage element in series with a control element.

42. An integrated circuit, comprising:
   a first segmented column line array extending in a second dimension, wherein each first segmented column line includes at least two first column lines;
   a first memory cell array which is disposed over the first segmented column line array, wherein the first segmented column line array intersects the first memory cell array so that each first column line intersects at least one first memory cell;
   a row line array extending in a first dimension, wherein the row line array is disposed over and intersects the first memory cell array;
   a second memory cell array which is disposed over the first row line array, wherein the first row line array intersects the second memory cell array;
   a second segmented column line array extending in a second dimension, wherein each second segmented column line includes least two second column lines, wherein the second segmented column line array is disposed over and intersects the second memory cell array so that each second column line intersects at least one second memory cell; and
   a conductive pillar array, wherein each conductive pillar is coupled to one first column line and one second column line so that the one first column line and the one second column line intersect the at least one first memory cell and the at least one second memory cell which do not intersect the same row line.

43. An embedded memory for an integrated circuit, comprising:
   a first segmented column line array extending in a second dimension, wherein each first segmented column line includes at least two first column lines;
   a first memory cell array which is disposed over the first segmented column line array, wherein the first segmented column line array intersects the first memory cell array so that each first column line intersects at least one first memory cell;
   a row line array extending in a first dimension, wherein the row line array is disposed over and intersects the first memory cell array;
   a second memory cell array which is disposed over the first row line array, wherein the first row line array intersects the second memory cell array;
   a second segmented column line array extending in a second dimension, wherein each second segmented column line includes least two second column lines, wherein the second segmented column line array is disposed over and intersects the second memory cell array so that each second column line intersects at least one second memory cell; and
   a conductive pillar array, wherein each conductive pillar is coupled to one first column line and one second column line so that the one first column line and the one second column line intersect the at least one first memory cell and the at least one second memory cell which do not intersect the same row line.

44. A memory carrier, comprising:
   at least one memory storage device, each including:
      a first segmented column line array extending in a second dimension, wherein each first segmented column line includes at least two first column lines;
      a first memory cell array which is disposed over the first segmented column line array, wherein the first segmented column line array intersects the first memory cell array so that each first column line intersects at least one first memory cell;
      a row line array extending in a first dimension, wherein the row line array is disposed over and intersects the first memory cell army;
      a second memory cell array which is disposed over the first row line array, wherein the first row line array intersects the second memory cell array;
      a second segmented column line array extending in a second dimension, wherein each second segmented column line includes least two second column lines, wherein the second segmented column line array is disposed over and intersects the second memory cell array so that each second column line intersects at least one second memory cell; and a conductive pillar array, wherein each conductive pillar is coupled to one first column line and one second column line so that the one first column line and the one second column line intersect the at least one first memory cell and the at least one second memory cell which do not intersect the same row line.

45. An electronic device, comprising:

a first segmented column line array extending in a second dimension, wherein each first segmented column line includes at least two first column lines;

a first memory cell array which is disposed over the first segmented column line array, wherein the first segmented column line array intersects the first memory cell array so that each first column line intersects at least one first memory cell;

a row line array extending in a first dimension, wherein the row line array is disposed over and intersects the first memory cell array;

a second memory cell array which is disposed over the first row line array, wherein the first row line array intersects the second memory cell array;

a second segmented column line array extending in a second dimension, wherein each second segmented column line includes least two second column lines, wherein the second segmented column line array is disposed over and intersects the second memory cell array so that each second column line intersects at least one second memory cell; and a conductive pillar array, wherein each conductive pillar is coupled to one first column line and one second column line so that the one first column line and the one second column line intersect the at least one first memory cell and the at least one second memory cell which do not intersect the same row line.

46. The electronic device of claim 45, wherein the electronic device is a computer system.

47. A memory array, comprising:

a first row line array extending in a first dimension;

at least two first column line segments, each disposed below the first row line array and lying along an axis which extends in a second dimension;

at least two first memory cells, wherein each first column line segment intersects at least one first memory cell and each first memory cell is intersected by a unique first row line;

at least two second column line segments, each disposed above the first row line array and aligned with corresponding first column line segments;

at least two second memory cells, wherein each second column line segment intersects at least one second memory cell and each second memory cell is intersected by the unique first row line; and means to interconnect the first and second column line segments to minimize leakage currents from the at least two first memory cells or the at least two second memory cells.

48. The memory array of claim 47, wherein the means to interconnect the first and second column line segments comprises at least three conductive pillars, wherein each of the second column line segments is coupled to a pillar and the corresponding first column line segment is coupled to another pillar.

49. The memory array of claim 48, further comprising:

a base column line extending in the second dimension; and at least three select switches, wherein each select switch is coupled to a unique one of the at least three pillars and is configured to conduct a current from the at least two first memory cells or the at least two second memory cells intersecting the first column line segment or the second column line segment coupled to the unique one of the at least three pillars.

50. The memory array of claim 49, wherein each of the select switches is a transistor coupled between the unique one of the at least three pillars and the base column line.

51. The memory array of claim 50, wherein the transistors are complementary metal-oxide semiconductor transistors.

52. The memory array of claim 49, wherein each memory cell includes a storage element in series with a control element.

53. A memory storage device, comprising:

a first and second memory cell each having a top end and a bottom end;

a first and second conductor, wherein the first and second conductors are substantially coplanar and parallel and extend in a first dimension, wherein the first conductor intersects the bottom end of the first memory cell and the second conductor intersects the top end of the second memory cell;

a first conductor segment which extends in a second dimension and intersects the top end of the first memory cell;

a second conductor segment which extends in the second dimension and intersects the bottom end of the second memory cell;

a via positioned between the first and second memory cell to couple the first conductor segment to the second conductor segment;

a base conductor extending in the second dimension; and means to conduct a sense current from the first memory cell or the second memory cell to the base conductor.

54. The memory storage device of claim 53, wherein the means to conduct the sense current includes a transistor coupled between the via and the base conductor.

55. The memory storage device of claim 54, wherein the transistor is a complementary metal-oxide semiconductor transistor.

* * * * *

UNITED STATES PATENT AND TRADEMARK OFFICE
CERTIFICATE OF CORRECTION

PATENT NO.       : 6,917,532 B2
APPLICATION NO.  : 10/177596
DATED            : July 12, 2005
INVENTOR(S)      : Van Brocklin et al.

Page 1 of 1

It is certified that error appears in the above-identified patent and that said Letters Patent is hereby corrected as shown below:

Col. 14 (line 62), delete "army;" and insert therefor --array;--.

Signed and Sealed this

Fifth Day of September, 2006

JON W. DUDAS
*Director of the United States Patent and Trademark Office*